United States Patent [19]

Carlin

[11] Patent Number: 4,894,833
[45] Date of Patent: Jan. 16, 1990

[54] SURFACE EMITTING LASERS WITH COMBINED OUTPUT

[75] Inventor: Donald B. Carlin, West Windsor Township, Mercer County, N.J.

[73] Assignee: General Electric Company, Schenectady, N.Y.

[21] Appl. No.: 230,105

[22] Filed: Aug. 9, 1988

[51] Int. Cl.$^4$ ............................................. H01S 3/19
[52] U.S. Cl. ......................................... 372/44; 372/50; 372/97; 372/102
[58] Field of Search .................... 372/45, 50, 96, 97, 372/48, 102, 18

[56] References Cited

U.S. PATENT DOCUMENTS

| | | | |
|---|---|---|---|
| 3,996,492 | 12/1976 | McGroddy | 313/500 |
| 4,092,659 | 5/1978 | Ettenberg | 357/17 |
| 4,719,635 | 1/1988 | Yeh | 372/50 |
| 4,730,325 | 3/1988 | Chow | 372/50 |
| 4,760,578 | 7/1988 | Oshima et al. | 372/50 |

FOREIGN PATENT DOCUMENTS 0123084 7/1985 Japan ............................... 372/45

OTHER PUBLICATIONS

Uematsu et al; "Grating-Coupled ... DBR"; Electronics Letters, vol. 13, No. 25; 12/08/1977; pp. 759-760.
N. W. Carlson et al., "Dynamically Stable 0° Phase Mode Operation of a Grating-Surface-Emitting Diode-Laser Array", Optics Letters, vol. 13, No. 4, Apr. 1988, pp. 312-314.
P. Zory et al., "Grating-Coupled Double-Heterostructure AlGaAs Diode Lasers," IEEE Journal of Quantum Electronics, vol. QE-11, No. 7, Jul. 1975, pp. 451-457.

Primary Examiner—Frank Gonzalez
Attorney, Agent, or Firm—Henry I. Steckler; James C. Davis, Jr.; Paul R. Webb, II

[57] ABSTRACT

Surface emitting lasers are laterally aligned and coupled together and also have their light output signals combined. This results in greater phase and frequency coherency and narrower and reduced amplitude sidelobes. Preferably, not more than two lasers are longitudinally aligned along the same axis for still greater coherency compared with adding the light output signals of more than two longitudinally aligned lasers. The lasers can be of the DH-LOC type or of the QW type.

3 Claims, 2 Drawing Sheets

SURFACE EMITTING LASERS WITH COMBINED OUTPUT

The invention described herein was made in the performance of work under NASA Contract No. NAS 1-17441 and is subject to the provisions of Section 305 of the National Aeronautics and Space Act of 1958 (72 Stat. 435; 42 U.S.C. 2457).

BACKGROUND OF THE INVENTION

The present invention relates to surface emitting lasers, and more particularly, to means for phase locking and combining the outputs of a pair of such lasers.

Surface emitting lasers have an advantage over edge emitting lasers in that since their light emitting surface (the area of a grating) is larger, the power density is lower, and therefore, more power can be generated without destructive heating effects. Further, the active section of a surface emitting laser can be made longer than that of a Fabry-Perot (FP) cavity laser for more gain without spurious frequency generation due to the use of the grating. For still higher power outputs surface emitting lasers can have their outputs combined using an optical waveguide and a grating or distributed Bragg reflector (DBR) such as shown in FIG. 1 of the article "Dynamically Stable 0° Phase Mode Operation Of A Grating-surface-emitting Diode-laser Array," by N. W. Carslon et al., Optics Letters, Volume 13, No. 4, April 1988, pp. 312-314. However, in such devices, due to losses in the waveguide, the phase locking of the numerous lasers may not be sufficient to prevent spurious frequency generation as well as an incoherent light beam with a broad main beamwidth and high amplitude and broad beamwidth sidelobes. It is known from P. Zory et al., "Grating-Coupled Double-Heterostructure AlGaAs Diode Lasers," IEEE Journal Of Quantum Electronics, Volume QE-11, No. 7, July 1975, pp. 451-457, to longitudinally align two lasers. However, the power is limited to that of a single pair of lasers.

It is, therefore, desirable to have a high power output from surface emitting lasers with good phase locking and a coherent output light beam.

SUMMARY OF THE INVENTION

A laser device in accordance with an embodiment of the invention comprises a semiconductor substrate having a major surface; a plurality of longitudinally and laterally aligned surface emitting lasers disposed on said substrate; and, only a single means for phase locking and combining the light output of said lasers and for providing an output light signal perpendicular to said major surface.

DETAILED DESCRIPTION OF THE PREFERRED EMBODIMENTS

Figure 1:
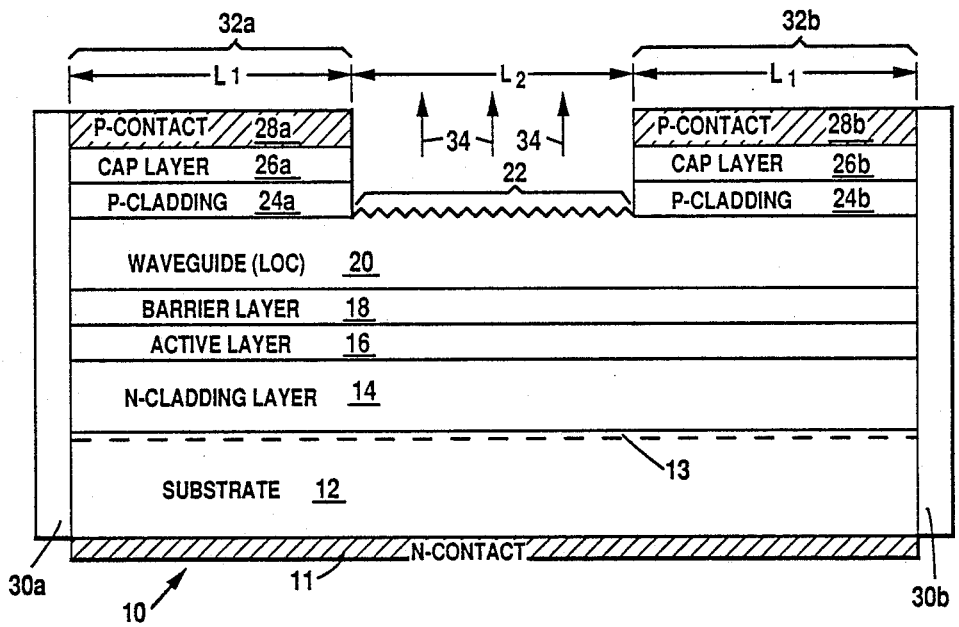
FIG. 1 is a side cross-sectional view of a double heterostructure-large optical cavity (DH-LOC) laser used in a first embodiment of the invention.

FIG. 1 shows a device, generally designated by numeral 10, comprising an N-contact 11, such as sintered Ni/Ge/Au, underneath a substrate 12, such as GaAs, of N-conductivity type with a doping level of about $10^{18}$ cm$^{-3}$ and a thickness of about 100 $\mu$m (micrometers). The central top of the substrate 12 has a 1 $\mu$m deep channel 13 (described in detail below) so that the lasers (described below) are of the channeled substrate planar (CSP) type. Overlying the substrate 12 is an N-cladding layer 14 of N-conductivity type. The layer 14 also provides a barrier to holes. Overlying the layer 14 is an active layer 16 with a thickness between about 500 to 2000 Å (Angstroms), preferably about 800 Å. The active layer 16 is not intentionally doped, and typically comprises Al$_z$Ga$_{1-z}$As wherein $0 \leq z \leq 0.13$. A barrier layer 18, which provides a barrier for electrons, overlies the active layer 16 and has a thickness of about 200-1000 Å and is not intentionally doped. It is to be understood that the layers 16 and 18 normally acquire some doping from their respective adjacent layers during fabrication. A large optical cavity (LOC) or waveguide layer 20 overlies the layer 18 and typically comprises Al$_y$Ga$_{1-y}$As, wherein $0.15 \leq y \leq 0.4$, with a thickness between about 0.25 to 1 $\mu$m and N-conductivity doping of about $5 \times 10^{17}$ cm$^{-3}$. In the middle of the upper surface of the waveguide layer 20 is a grating surface 22 comprising surface corrugations with a peak-to-valley amplitude of about 1000 Å and with a spacing of about $\lambda/n_e$, where $\lambda$ is the wavelength of the generated light and $n_e$ is the effective index of refraction of the guided mode. The profile of the corrugations is chosen such that the $\lambda/n_e$ periodic structure comprises significant components at $\lambda/n_e$, for example, by using V grooves where the width of the top of the groves is about half of the intergroove spacing. A P-cladding layer 24 has segments 24a and 24b that overlie the ends of the layer 20, respectively, and is P-conductivity type doped. The layers 14, 18, and 24 typically are of Al$_x$Ga$_{1-x}$As, wherein $0.3 \leq x \leq 0.8$. The cladding layers 14 and 24 typically have a thickness of about 1 $\mu$m and a doping level of about $5 \times 10^{17}$ cm$^{-3}$. A capping layer 26 has segments 26a and 26b that overlie the layer segments 24a and 24b, respectively, and typically is of GaAs P-conductivity doped with a doping level between about $10^{18}$ to $10^{19}$ cm$^{-3}$ and thickness of about 0.5 $\mu$m. A P-contact layer 28 has segments 28a and 28b that overlie the layer segments 26a and 26b, respectively, and typically comprises successive layers of Ti/Pt/Au, with the Ti layer next to the layer 26. At the sides of the structure are reflective facet layers 30a and 30b such as appropriately cleaved ends with a dielectric stack of alternate layers of SiO$_2$ and Al$_2$O$_3$. Typically about three such pairs (six layers) are used, each layer having a thickness of about one quarter wavelength, such as shown in U.S. Pat. No. 4,092,659.

Figure 2:
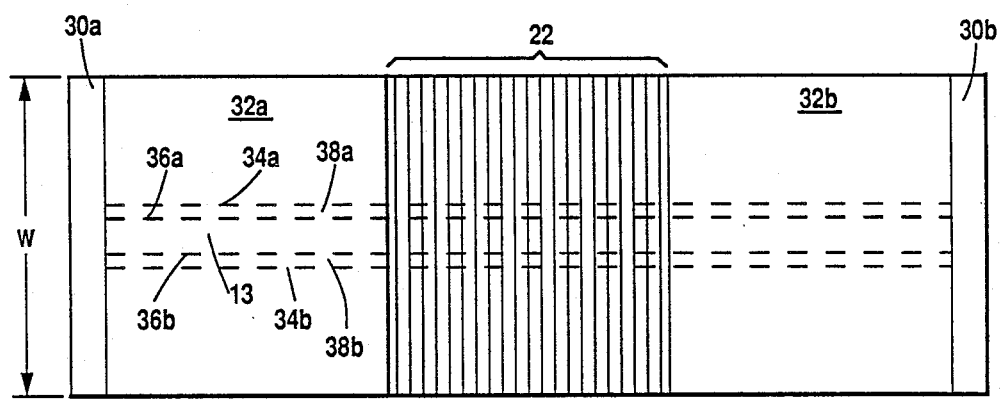
FIG. 2 is a top view of FIG. 1.

It will be appreciated that longitudinally aligned DH-LOC lasers 32a and 32b are formed by the structure described above, each having a length L1 preferably of about 200 $\mu$m. The grating length L2 is preferably about 300 $\mu$m. Thus, the laser regions 32a and 32b are spaced apart on opposing sides of the grating surface 22 with the grating 22 extending over a central region of the laser device between the laser regions 32a and 32b. As shown in FIG. 2 the device 10 has a width W of about 300 $\mu$m. The top of the channel 13 at the top of the substrate 12, indicated by the dotted lines 34a and 34b, is preferably about 4 to 8 μm wide, while the bottom of the channel 13, indicated by the dotted line 36a and 36b, is narrower. The sidewalls therebetween, designated 38a and 38b, make an angle of about 57 degrees with the top of the substrate 12.

This embodiment can be made by the liquid phase epitaxial process with appropriate reagents and dopants all as known in the art. The channel 13 can be formed by etching the substrate 12 along its 111A plane using Caros solution at 20° C., which in this case is a mixture of $H_2SO_4/H_2O_2/H_2O$ in a 5/1/1 ratio by volume. Similarly, the respective segments of the layers 24, 26, and 28 can be formed by etching the central portions of the layers 24, 26, and 28, while masking their end portions, which are part of the lasers 32a and 32b. A preferrential etchant, such as 1/1/8 Caros solution can be used.

In operation, a positive voltage is applied to the P-contact 28 and a negative voltage to the N-contact 11. Holes are injected from the P-contact 28 into the active layer 16 with the cladding layer 14 providing a barrier against further downward movement by holes. Similarly, electrons are injected from the N-contact 11 into the active layer 16 with the barrier layer 18 providing a barrier against further upward movement by electrons. At a threshold current, population inversion occurs and, therefore, stimulated emission of photons. Photons generated by both laser regions 32a and 32b are present in the waveguide 20 and a first portion of the photons incident on the grating surface, through the interaction with the $\lambda/n_e$ component of the grating, is emitted by the perpendicular to the waveguide 20 as indicated by the arrows 34. A second portion of the photons incident on the grating surface 22 is reflected back into the laser regions 32a and 32b through the action of the $\lambda/n_e$ component of the grating surface 22, thereby increasing the optical feed back and enhancing the lasing action. Because the amount of reflection is dependent on the wavelength of the light generated by each laser device, a significant amount of feedback is present only at one specific period. The light generated by the laser regions 32a and 32b is thereby frequency locked. The remaining portion of the photons incident on the grating surface 22 generated by each of the laser regions 32a and 32b is transmitted through the optical medium 20 to the other laser region, thereby phase locking the two laser regions together. Since both laser regions 32a and 32b share the same device, the light generated by both laser regions is locked in both frequency and phase, and is emitted through the grating surface perpendicular to the grating surface.

It will be appreciated that since only two longitudinally aligned laser regions 32a and 32b are used, the waveguide 20 can be relatively short and, hence, have a low loss, therefore, and phase and frequency locking of the two lasers 32a and 32b is greater than if more such lasers are used. In turn, this results in stabilizing the longitudinal mode of the lasers 32 resulting in a single emission frequency compared to the plurality of modes in an Fabry-Perot cavity laser. Further, more light power output is available compared to using just a single laser.

Figure 3:
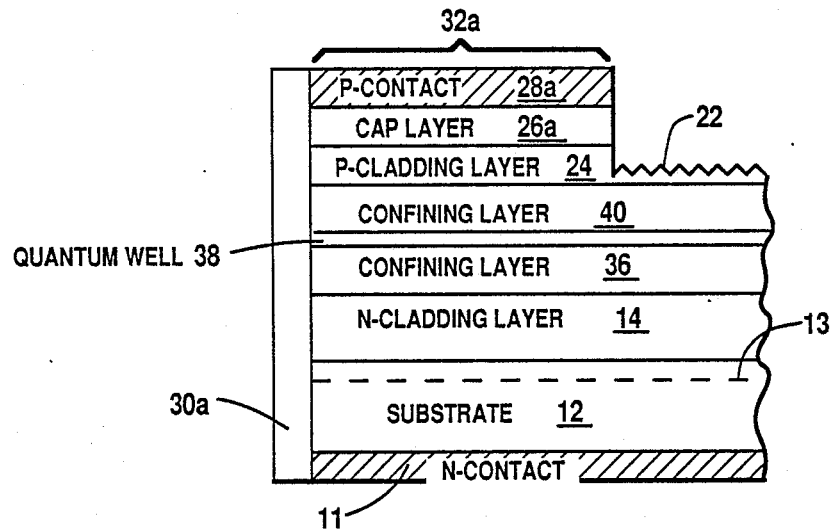
FIG. 3 is a side cross-sectional view of a quantum well (QW) laser used in a second embodiment of the invention.

FIG. 3 shows a second embodiment of the laser regions 32a and 32b which are of the QW type. Only the laser 32a is shown as it will be understood that the laser 32b is identical. Elements of FIG. 3 that correspond to elements in FIG. 1 are given corresponding reference numerals. The cladding layers 14 and 24 are between about 0.5 to 2.5 μm thick and comprise $Al_xGa_{1-x}As$, wherein $0.4 \leq x \leq 1$, with a doping level between about $10^{17}$ to $5 \times 10^{18}$ cm$^{-3}$ of the appropriate conductivity type dopant. The central portion of the cladding 24 comprises the DBR 22 and is about 1000 Å thick at the valleys of the DBR 22. Undoped confining layers 36 and 40 are between about 500 to 4000 Å thick and comprise $Al_xGa_{1-x}As$, wherein $0.15 \leq x \leq 0.60$, and can be either graded or ungraded. The undoped quantum well layer 38 is between about 10 to 400 Å thick and comprises $Al_xGa_{1-x}As$, wherein $0 \leq x \leq 1$.

In general, the QW embodiment of FIG. 3 has a lower threshold current, reduced variation of the threshold current with temperature, and increased differential quantum efficiency compared to DH-LOC lasers.

Figure 4:
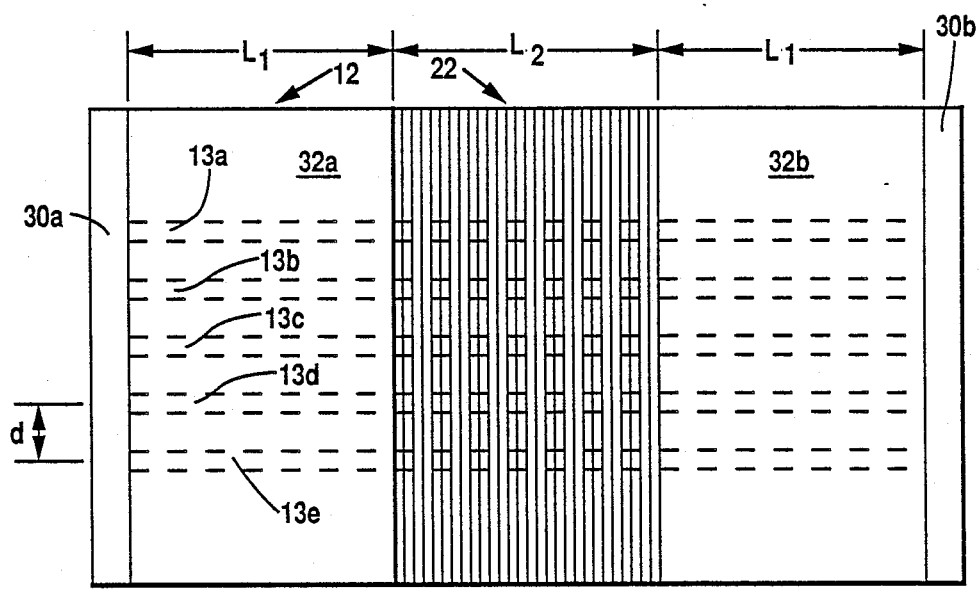
FIG. 4 is a top view of an embodiment of the invention showing a plurality of laterally adjacent lasers.

FIG. 4 shows a device in accordance with an embodiment of the invention to obtain more light output power compared to using just a single pair of lasers, while maintaining phase and frequency coherency. In this embodiment, the substrate 12 is laterally extended compared to FIG. 2, as are the reflective facet layers 30a and 30b and the grating surface 22. The grating surface 22 thereby comprises only a single integral means for phase locking and combining the outputs of all of the lasers to achieve a high coherency. For the sake of clarity, only the channels 13 are shown of the CSP-LOC laser regions 32a and 32b. Each of the five channels 13 extends under only a pair of corresponding longitudinally aligned lasers as in FIG. 1. Thus, there are a total of ten lasers. Also, the channels 13a, 13b, 13c, 13d, and 13e are mutually laterally aligned with a typical center-to-center spacing "d" between about 4 to 10 μm. Thus, the lasers have their lateral optical modes (parallel to the junction plane) coupled together resulting in phase and frequency coupling and coherency for the entire array. The entire array will, therefore provide single wavelength light output from the grating surface 22 normal to the substrate 12. Depending upon L1 and the efficiency of grating surface 22 it is possible to increase the light output by about 10 to 50 times that of a single laser. QW lasers as shown in FIG. 3 could also be used in FIG. 4 instead of DH-LOC lasers.

What is claimed is:

1. A surface emitting semiconductor laser device for emitting an output light signal perpendicular to a major surface thereof, comprising:

a substrate having first and second opposing major surfaces;

first contact means over said first major surface of said substrate;

first and second longitudinally spaced apart and laterally aligned laser regions defining a central region therebetween and said laser regions being disposed on said second major surface of said substrate;

an optical medium extending over the central region and the first and second laser regions through which light generated by the first and second laser regions propagates;

a capping layer and second contact means overlying the optical medium;

a single optical grating surface etched into the second contact means and the capping layer to extend over said central region in optical communication with the optical medium to define said major surface of said laser device wherein the first and second laser regions are disposed on opposing sides longitudinally of the grating surface, said grating surface having grating periods for phase locking and combining the light propagations in the optical medium and generated by said first and second laser regions and for allowing said output light signal to be emitted therethrough perpendicular to said major surface of said laser device; and wherein the first and second laser regions each comprise a plurality of laterally aligned phase-locked lasers disposed on said second major surface of said substrate with corresponding spaced-apart lasers of each of the first and second longitudinal laser regions being longitudinally aligned.

2. The device of claim 1 wherein each of said laser comprise a DH-LOC laser.

3. The device of claim 1 wherein each of said lasers comprise a QW laser.

* * * * *